(12) United States Patent
Geohegan et al.

(10) Patent No.: US 7,763,353 B2
(45) Date of Patent: Jul. 27, 2010

(54) FABRICATION OF HIGH THERMAL CONDUCTIVITY ARRAYS OF CARBON NANOTUBES AND THEIR COMPOSITES

(75) Inventors: David B. Geohegan, Knoxville, TN (US); Ilya N. Ivanov, Knoxville, TN (US); Alexander A. Puretzky, Knoxville, TN (US)

(73) Assignees: UT-Battelle, LLC, Oak Ridge, TN (US); University of Tennessee Research Foundation, Knoxville, TN (US)

( * ) Notice: Subject to any disclaimer, the term of this patent is extended or adjusted under 35 U.S.C. 154(b) by 1188 days.

(21) Appl. No.: 11/150,776

(22) Filed: Jun. 10, 2005

(65) Prior Publication Data

US 2006/0279191 A1     Dec. 14, 2006

(51) Int. Cl.
*B32B 9/00*  (2006.01)
(52) U.S. Cl. ............... 428/408; 977/742; 423/447.1
(58) Field of Classification Search ............... 428/408; 427/95; 977/742; 423/447.1, 447.2, 447.3, 423/445 B; 264/29.1
See application file for complete search history.

(56) References Cited

U.S. PATENT DOCUMENTS

| | | | |
|---|---|---|---|
| 6,649,431 B2 | 11/2003 | Merkulov et al. | |
| 6,692,324 B2 | 2/2004 | Simpson et al. | |
| 6,858,455 B2 | 2/2005 | Guillorn et al. | |
| 6,958,572 B2 * | 10/2005 | Merkulov et al. | 313/311 |
| 2002/0179564 A1 | 12/2002 | Geohegan et al. | |
| 2003/0052585 A1 | 3/2003 | Guillorn et al. | |
| 2003/0148577 A1 | 8/2003 | Merkulov et al. | |
| 2003/0231471 A1 | 12/2003 | DeLorenzo et al. | |
| 2004/0005736 A1 | 1/2004 | Searls et al. | |
| 2004/0071870 A1 * | 4/2004 | Knowles et al. | 427/200 |
| 2004/0197909 A1 | 10/2004 | McKnight et al. | |
| 2005/0103993 A1 | 5/2005 | Guillorn et al. | |
| 2005/0106094 A1 | 5/2005 | Kondo | |
| 2008/0090183 A1 * | 4/2008 | Zhu et al. | 430/324 |
| 2008/0318049 A1 * | 12/2008 | Hata et al. | 428/408 |

FOREIGN PATENT DOCUMENTS

| | | | |
|---|---|---|---|
| WO | WO 03/004741 A1 | 1/2003 |
| WO | WO 2004/096704 A1 | 11/2004 |

OTHER PUBLICATIONS

Zhang (Electrical-Field-Direct growth of aligned single walled carbon nanotubes; Applied Physics Letters vol. 79 No. 19; Nov. 5, 2001).*

(Continued)

*Primary Examiner*—David R Sample
*Assistant Examiner*—Daniel Miller
(74) *Attorney, Agent, or Firm*—Brinks Hofer Gilson & Lione (57) ABSTRACT

Methods and apparatus are described for fabrication of high thermal conductivity arrays of carbon nanotubes and their composites. A composition includes a vertically aligned nanotube array including a plurality of nanotubes characterized by a property across substantially all of the vertically aligned nanotube array. A method includes depositing a vertically aligned nanotube array that includes a plurality of nanotubes; and controlling a deposition rate of the vertically aligned nanotubes array as a function of an in situ monitored property of the plurality of nanotubes.

36 Claims, 10 Drawing Sheets

OTHER PUBLICATIONS

Substrate effect on the growth of carbon nanotubes by thermal decomposition of methane; J.W. Ward, Chemical Physics Letters 376 (2003) 717-725.*

D. B. Geohegan, A. A. Puretzky, I. N. Ivanov, S. Jesse, G. Eres, J. Y. Howe, "In situ growth rate measurements and length control during chemical vapor deposition of vertically aligned multiwall carbon nanotubes," Applied Physics Letters, vol. 83, No. 9, Sep. 1, 2003.

International Search Report and Written Opinion from PCT/US2006/023117, mailed Oct. 26, 2006.

* cited by examiner

FABRICATION OF HIGH THERMAL CONDUCTIVITY ARRAYS OF CARBON NANOTUBES AND THEIR COMPOSITES

STATEMENT AS TO RIGHTS TO INVENTIONS MADE UNDER FEDERALLY-SPONSORED RESEARCH OR DEVELOPMENT

This invention was made with United States Government support under prime contract No. DE-AC05-00OR22725 to UT-Battelle, L.L.C. awarded by the Department of Energy. The Government has certain rights in this invention.

BACKGROUND INFORMATION

1. Field of the Invention

Embodiments of the invention relate generally to the field of high thermal conductivity arrays of nanotubes. More particularly, an embodiment of the invention relates to fabrication of high thermal conductivity arrays of carbon nanotubes and their composites.

2. Discussion of the Related Art

Figure 10:
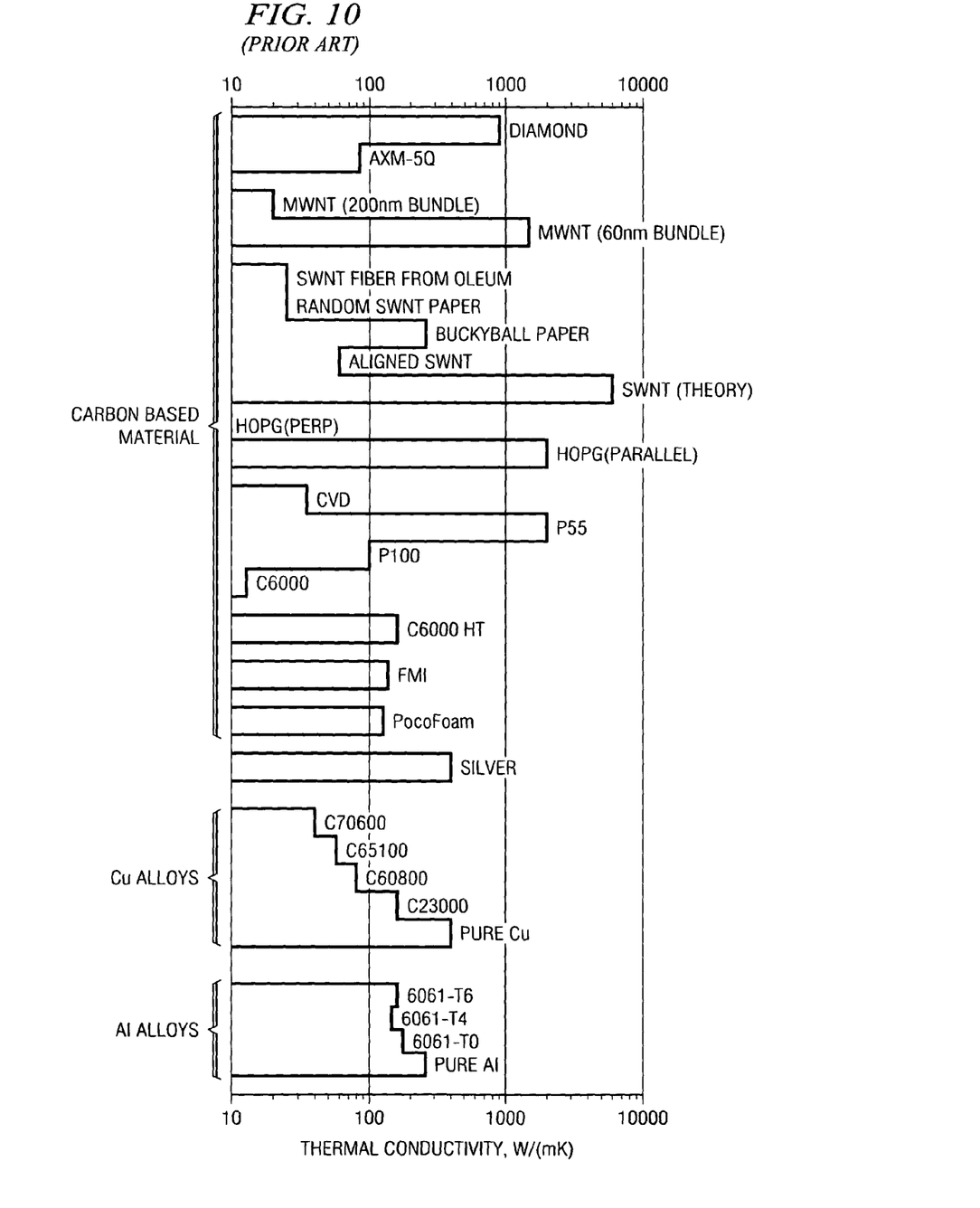
FIG. 10 depicts a comparison of thermal conductivity of different materials, appropriately labeled "PRIOR ART."

Thermal management of microelectronic packages is an ever-increasing problem as chip sizes become smaller and more densely packed with transistors. Conventional thermal interface materials (TIMs) are losing the ability to carry the corresponding heat from integrated circuits (ICs) to their cooling fins. Carbon nanotubes with their high thermal conductivities have been envisioned as an enabling technology to provide this heat pathway. FIG. 10 depicts a comparison of thermal conductivities of carbon-based materials and other materials. However, although individual nanotubes exhibit sufficiently high thermal conductivities, assemblies of nanotubes in the forms of fibers, papers, and other composites do not. A single single-walled carbon nanotube (SWNT) exhibits highly directional thermal conductivity of 3000 W/mK along its axis (Dresselhaus, 1985) while a fiber of bundled SWNTs exhibits only 20 W/mK (see FIG. 10). Although SWNTs and multiwall carbon nanotubes (MWNTs) can be assembled into papers, fibers, and other aggregated forms, these aggregated forms are not optimally assembled for high thermal conductivity. In the past, processing nanotubes has invariably resulted in their aggregation. When nanotubes touch one another and heat is required to hop from one nanotube to another, high thermal diffusivities and directional properties are lost.

The problems that need to be solved are i) microelectronic package thermal management, ii) thermal interface materials that posses sufficiently high heat carrying capacity and iii) nanotubes that are optimally assembled without aggregation. What is needed is a solution that simultaneously solves all of these problems.

SUMMARY OF THE INVENTION

There is a need for the following embodiments of the invention. Of course, the invention is not limited to these embodiments.

According to an embodiment of the invention, a composition comprises a vertically aligned nanotube array including a plurality of nanotubes, each of the nanotubes coupled at a proximal end to a substrate, wherein thermal diffusivity of the plurality of nanotubes increases as a function of distance from the substrate as characterized by a G:D Raman mode band intensity ratio that increases as the function of distance from the substrate across substantially all of the vertically aligned nanotube array. According to another embodiment of the invention, a method, comprises depositing a vertically aligned nanotube array that includes a plurality of nanotubes, each of the nanotubes coupled at a proximal end to a substrate; and controlling a deposition rate of the vertically aligned nanotubes array as a function of an in situ monitored thermal diffusivity of the plurality of nanotubes, wherein the in situ monitored thermal diffusivity is characterized by a G:D Raman mode band intensity ratio that increases as a function of distance from the substrate across substantially all of the vertically aligned nanotube array. According to another embodiment of the invention, a composition comprises a vertically aligned nanotube array including a plurality of nanotubes wherein thermal diffusivity of the plurality of nanotubes is characterized by a G:D Raman mode band intensity ratio of greater than approximately 1 across substantially all of the vertically aligned nanotube array. According to another embodiment of the invention, a method, comprises depositing a vertically aligned nanotube array that includes a plurality of nanotubes, each of the nanotubes coupled at a proximal end to a substrate; and controlling a deposition rate of the vertically aligned nanotubes array as a function of an in situ monitored thermal diffusivity of the plurality of nanotubes, wherein the in situ monitored thermal diffusivity is characterized by a G:D Raman mode band intensity ratio of greater than approximately 1 across substantially all of the vertically aligned nanotube array.

According to another embodiment of the invention, a composition comprises a vertically aligned nanotube array including a plurality of nanotubes wherein alignment of the plurality of nanotubes is characterized by a polarized Raman mode band intensity ratio of greater than approximately 2 as measured by at least one member selected from a G band and an RBM band across substantially all of the vertically aligned nanotube array. According to another embodiment of the invention, a method, comprises depositing a vertically aligned nanotube array that includes a plurality of nanotubes, each of the nanotubes coupled at a proximal end to a substrate; and controlling a deposition rate of the vertically aligned nanotubes array as a function of an in situ monitored alignment of the plurality of nanotubes, wherein the in situ monitored alignment of the plurality of nanotubes is characterized by a polarized Raman mode band intensity ratio of greater than approximately 2 as measured by at least one member selected from a G band and an RBM band across substantially all of the vertically aligned nanotube array.

According to another embodiment of the invention, a composition comprises a vertically aligned nanotube array including a plurality of nanotubes wherein thermal diffusivity of the plurality of nanotubes is characterized by a G Raman mode band width of less than approximately 20 $cm^{-1}$ measured at 633 nm across substantially all of the vertically aligned nanotube array. According to another embodiment of the invention, a method comprises depositing a vertically aligned nanotube array that includes a plurality of nanotubes, each of the nanotubes coupled at a proximal end to a substrate; and controlling a deposition rate of the vertically aligned nanotubes array as a function of an in situ monitored alignment of the plurality of nanotubes, wherein the in situ monitored thermal diffusivity of the plurality of nanotubes is characterized by a G Raman mode band width of less than approximately 20 $cm^{-1}$ measured at 633 nm across substantially all of the vertically aligned nanotube array.

These, and other, embodiments of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of an embodiment of the invention without departing from the spirit thereof, and embodiments of the invention include all such substitutions, modifications, additions and/or rearrangements.

BRIEF DESCRIPTION OF THE DRAWINGS

The drawings accompanying and forming part of this specification are included to depict certain embodiments of the invention. A clearer conception of embodiments of the invention, and of the components combinable with, and operation of systems provided with, embodiments of the invention, will become more readily apparent by referring to the exemplary, and therefore nonlimiting, embodiments illustrated in the drawings. Embodiments of the invention may be better understood by reference to one or more of these drawings in combination with the description presented herein. It should be noted that the features illustrated in the drawings are not necessarily drawn to scale.

DESCRIPTION OF PREFERRED EMBODIMENTS

Embodiments of the invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the embodiments of the invention in detail. It should be understood, however, that the detailed description and the specific examples, while indicating preferred embodiments of the invention, are given by way of illustration only and not by way of limitation.

Various substitutions, modifications, additions and/or rearrangements within the spirit and/or scope of the underlying inventive concept will become apparent to those skilled in the art from this disclosure.

Within this application several publications are referenced by Arabic numerals, or principal author's name followed by year of publication, within parentheses or brackets. Full citations for these, and other, publications may be found at the end of the specification immediately preceding the claims after the section heading References. The disclosures of all these publications in their entireties are hereby expressly incorporated by reference herein for the purpose of indicating the background of embodiments of the invention and illustrating the state of the art.

The below-referenced U.S. Patents and U.S. Patent Applications disclose embodiments that are useful for the purposes for which they are intended. The entire contents of U.S. Pat. Nos. 6,692,324; 6,649,431; and 6,858,455 are hereby expressly incorporated by reference herein for all purposes. The entire contents of U.S. Ser. No. 09/997,600, filed Nov. 28, 2001; Ser. No. 09/964,270, filed Sep. 26, 2001; Ser. No. 10/068,795, filed Feb. 6, 2002; Ser. No. 10/408,294, filed Apr. 7, 2003; and Ser. No. 10/716,770, filed Nov. 19, 2003 are hereby expressly incorporated by reference herein for all purposes.

As noted above, the requirement(s) of i) microelectronic package thermal management, ii) thermal interface materials that posses sufficiently high heat carrying capacity and iii) nanotubes that are optimally assembled without aggregation referred to above have not been fully met. The solution to these problems is to directly synthesize nanotubes in optimal compositions for applications requiring high thermal conductivity. Preferred embodiments of the invention should contain: (a) high densities of aligned nanotubes in arrays (e.g., with internanotube spacing of approximately a few nm); (b) continuous nanotubes over their entire length, from top to bottom in the array (i.e., along a longitudinal z axis perpendicular to the plane of the substrate); (c) spacing between the nanotubes to minimize internanotube contact; (d) a high degree of crystallinity and order in the nanotubes as measured by Raman spectroscopy with ratios of carbon G:D band intensities >1 over the entire array; (e) preferably a high fraction of individual single walled carbon nanotubes; (f) a smooth surface for ability to interface to smooth surfaces; (g) the ability to conform to irregular surfaces for good thermal interfacial properties; (h) the ability to be synthesized in patterns for vertical integration in microelectronics; (i) high measured thermal diffusivities (>1 $cm^2/s$) and thermal conductivities (600-1000 W/mK); (j) the ability to grow the nanotubes to arbitrary, predetermined heights; and (k) highly anisotropic thermal diffusivities (>40:1, longitudinal to transverse ratio). An important aspect of the invention is the ability to controllably synthesize arrays with compositions that yield extremely high thermal diffusivities. The ability to synthesize long arrays of nanotubes, with continuous fibers from top to bottom, in macroscopic quantities sufficient for flash diffusivity measurements (as evidenced by the data contained in the attached figures) is an important aspect of the invention. This ability allows the thermal properties of the arrays to be measured in their as-synthesized state for the first time.

The invention can include a composition of carbon nanotubes exhibiting very high thermal diffusivity and conductivity. Vertically aligned carbon nanotube arrays containing a high degree of crystallinity and optimal internanotube spacings provide exceptional thermal properties. The growth methods of these arrays and the characterization methods required to assess and optimize the thermal conductivity of this structure are described below in detail. Methods of making composites with significantly enhanced and highly anisotropic thermal conductivities based on these nanotube arrays are also embodiments of the invention.

This invention can include a composition of material which includes (e.g., carbon) nanotubes in aligned arrays. The nanotubes are primarily continuous from top to bottom of the array. The nanotubes in the arrays may be multiwalled carbon nanotubes (MWNTs) which generally refers to nanotubes including between approximately 4 and approximately 10 walls, few-wall nanotubes (FWNTs) which generally refers to approximately 1-3 walls, designated as single-wall carbon nanotubes (SWNTs), double wall carbon nanotubes (DWNTS) or triple-wall carbon nanotubes (TWNTs), respectively. Preferred embodiment of the invention can include compositions where the nanotubes are spaced at optimal distances from one another to minimize thermal transfer losses, thereby maximizing their collective thermal diffusivity. The invention can include a method of (1) fabricating the arrays, (2) characterizing the properties of the arrays, and/or (3) testing the thermal properties of these arrays. By combining all three of these procedures, preferred embodiments of the invention are capable of ensuring compositions that meet rigorous standards.

Vertically-Aligned Nanotube Array (VANTA) Fabrication

Figure 1A:
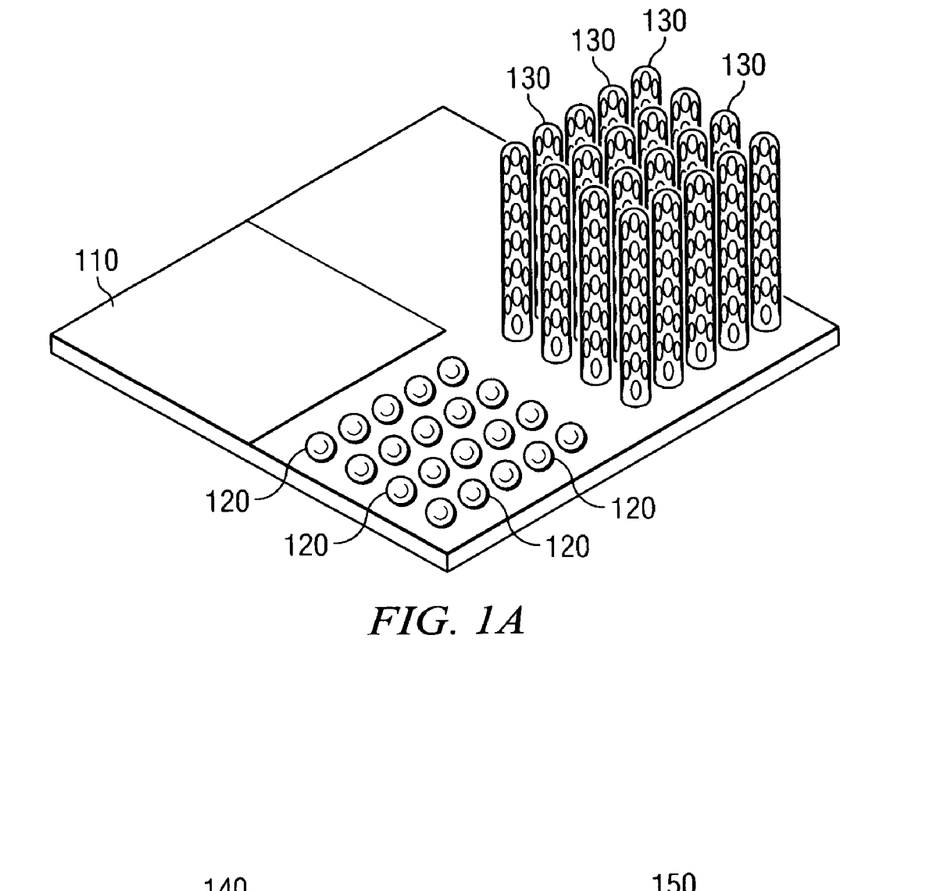
FIG. 1A is a perspective view of a catalyst self-assembly and nanotubes growth process, representing an embodiment of the invention.
Figure 1B:
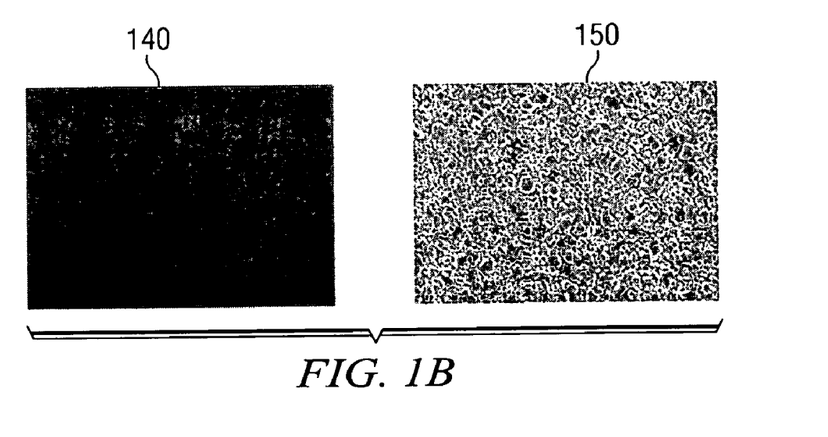
FIG. 1B is a micrograph view of a roughening of thin metal catalyst film process, representing an embodiment of the invention.

Vertically-aligned nanotube arrays (VANTAs) can be synthesized by thermal chemical vapor deposition of hydrocarbon feedstocks onto substrates which are prepatterned with metal catalyst films. Multilayers of thin metal films are sequentially deposited by electron beam evaporation or other deposition technique to form layers which comprise a buffer layer (e.g. Al) which is in contact with the substrate, then metal catalysts (e.g. 0.2-1.0 nm of Fe, and possibly another metal layer such as 0.2 nm of Mo). This patterned substrate is placed inside a tube furnace and the temperature is raised under hydrogen and argon gas flow at various pressures. During this procedure, the film roughens to form ~nm sized catalyst particles amidst the roughened and partially oxidized buffer layer film, as indicated in FIGS. 1A-1B. Hydrocarbon feedstocks with other gases (e.g. acetylene with hydrogen and argon, or ethanol with hydrogen and argon, or methanol with hydrogen and argon) are passed over the catalyst particles and carbon nanotubes begin to grow. This part of the invention is not unusual, and may be termed 'thermal CVD'.

Referring to FIG. 1A a schematic shows a VANTA growth approach. A smooth metallic multilayer film 110 is roughened using heat treatments to form high densities of catalyst nanoparticles 120, then hydrocarbon gas and processing conditions are adjusted to produce high nucleation densities of carbon nanotubes 130. Self-assembling VANTAs are formed if the nucleation density is great enough. Referring to FIG. 1B, actual electron micrographs of films before pretreatment 140 and after pretreatment 150 are depicted.

VANTA Length Measurement and Control using in situ Interferometry and Photography The invention can include the utilization of a reflected laser beam during the growth procedure, called time resolved reflectivity (TRR). The substrate 205 is positioned such that the reflected laser beam 210 may be monitored by a photodiode 215. The reflected beam intensity is used to understand the growth process. This general TRR technique has been described (Geohegan, 2003). For the formation of a high thermal conductivity nanotubes array, it is preferred that the density of nucleation of the nanotube array be sufficient to produce a vertically-standing structure. This is signaled by the presence of Fabry-Perot interference fringes as indicated in FIG. 2B.

Figure 2A:
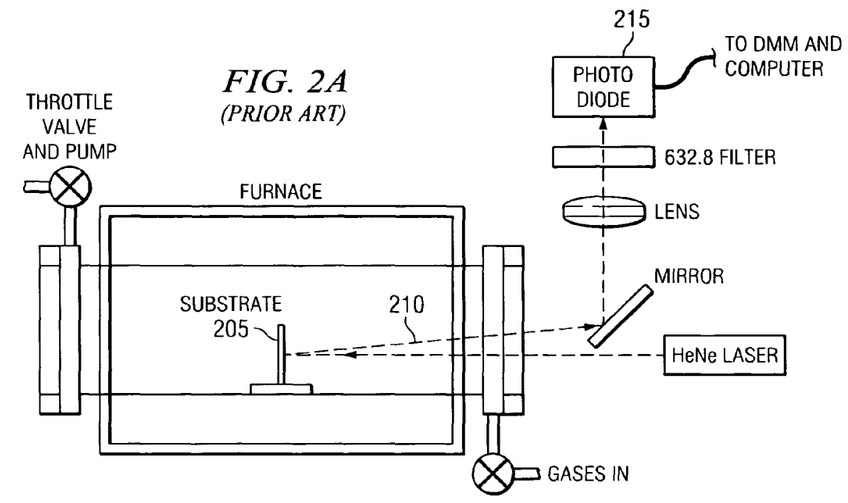
FIG. 2A is a schematic view of an apparatus, appropriately labeled "PRIOR ART."
Figure 2B:
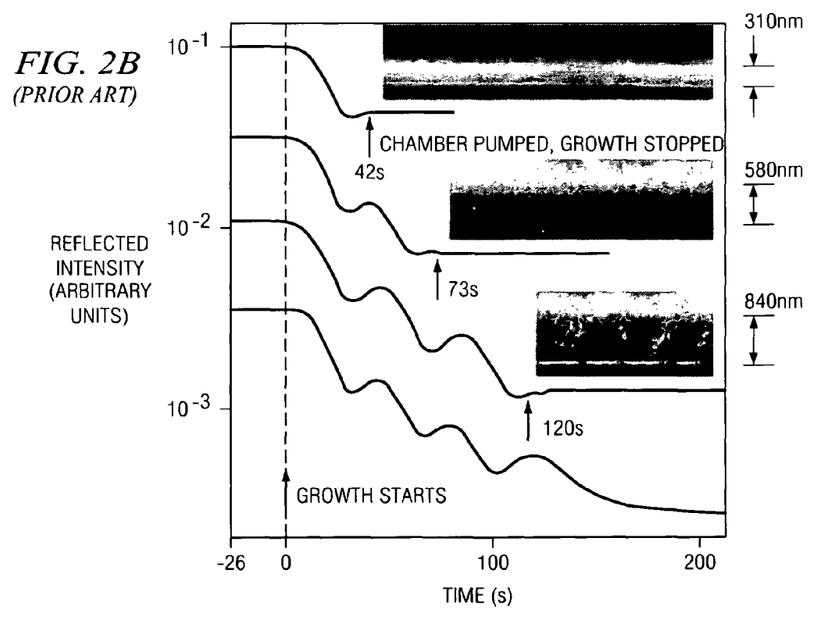
FIG. 2B is a composite view of traces of reflected intensity as a function of time with three micrographs of vertically aligned nanotubes arrays acquired at 42, 73 and 120 seconds, appropriately labeled "PRIOR ART."

FIG. 2A depicts an experimental setup for in situ length control and density control of VANTAs during growth. The reflected laser beam is monitored via a photodiode, and provides information about the length of the nanotube array vs. time (via the number of fringes) as well as the optical properties of the array (via the attenuation of the signal). Since the optical properties of the array are dependent on the type of nanotube being grown, and the spacing between the nanotubes in the array (key components for highly thermally conducting VANTAs), this technique provides unique information crucial to optimal VANTA fabrication for high thermal conductivity applications.

These fringes come from interference between the light reflected from the substrate (after passing twice through the VANTA) and that reflected from the top of the VANTA. As shown in FIG. 2B, the height of the nanotubes array may be controlled precisely (within ~20 nm) by evacuating the growth chamber after a desired number of Fabry-Perot fringes. Since each fringe corresponds to ~300 nm height, this procedure guarantees that (1) a vertically-oriented array has been grown, (2) the array's top surface is flat enough to provide a coherent reflection and (3) the array's height is known. This in situ reflectivity procedure may be used to control the height of the VANTAs over the first 20 microns of growth. After this point, the arrays become too optically absorbing for the light to pass twice through the VANTA.

Another unique aspect of the invention is the use of in situ photography to monitor the height of the arrays for lengths greater than 20 microns. For this purpose a remote microscope is used to view the nanotube arrays and measure their growth rate directly by photography, providing in situ control over the VANTA height via rapid evacuation of the chamber at the desired length. These techniques permit the growth rate of the VANTA to be measured and adjusted. This provides a method of control over array fabrication impossible without this invention.

VANTA Porosity Control

Figure 3A:
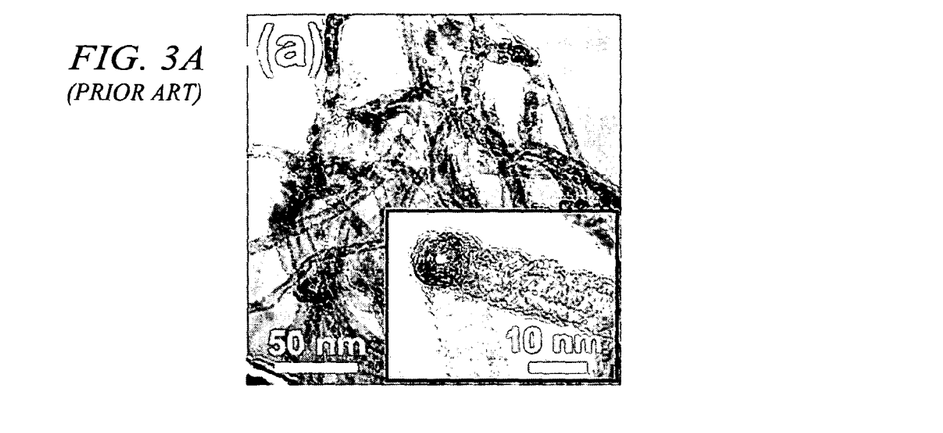
FIG. 3A is a composite micrograph view of multiwalled carbon nanotubes (MWNTs), appropriately labeled "PRIOR ART."
Figure 3B:
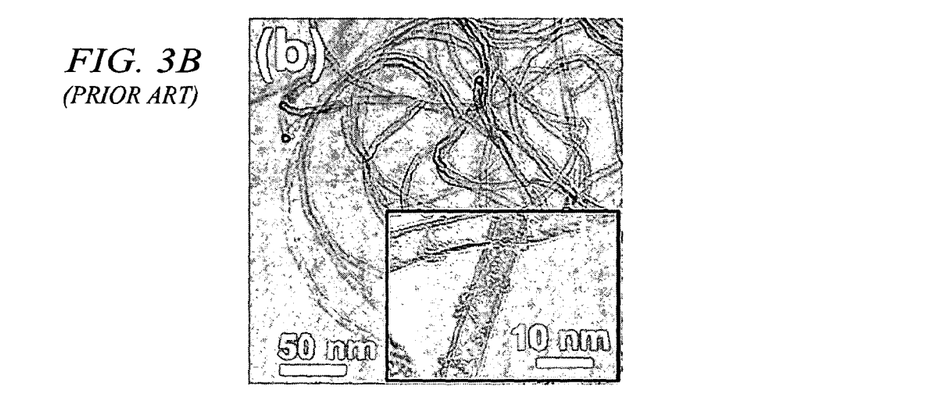
FIG. 3B is a composite micrograph view of double wall carbon nanotubes (DWNTs), appropriately labeled "PRIOR ART."
Figure 3C:
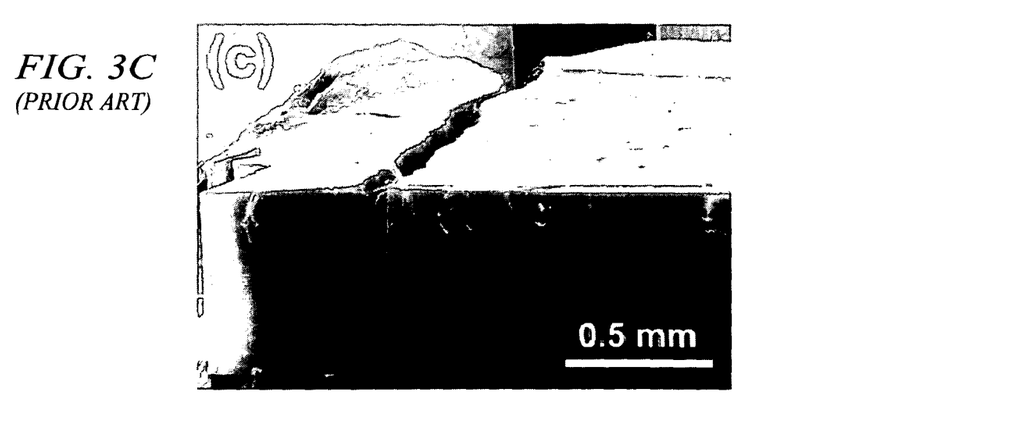
FIG. 3C is a micrograph view of a vertically aligned nanotubes array (VANTA), appropriately labeled "PRIOR ART."

Embodiments of the invention can use time resolved reflectivity (TRR) to assess the density of the nanotube array during growth. For high thermal conductivity nanotube arrays, the spacing between the nanotubes in the array must be controlled. As shown in FIGS. 3A-3C, different types of nanotubes are reproducibly grown at different temperatures from a given feedstock and catalyst combination. From the attenuation of the time resolved reflectivity (TRR) beam, and the known height of the array during growth (via the number of fringes), relative densities of the VANTA arrays may be calculated once densities of previous arrays have been calculated and correlated with measured time resolved reflectivity (TRR) signals. This provides a method to control process parameters to grow VANTAs with predetermined porosities (spacings between the nanotubes).

FIGS. 3A and 3B depict MWNT and DWNT grown at 575 C and 725 C, respectively, from an Al/Fe/Mo multilayer thin film. The MWNT have ~7 walls, and the DWNT have 2 walls. FIG. 3C depicts a near millimeter-long (tall) VANTA on a Si substrate. The side perspective of FIG. 3C shows the flatness of the top of the VANTA.

Patternability of the VANTAs

Figure 4A:
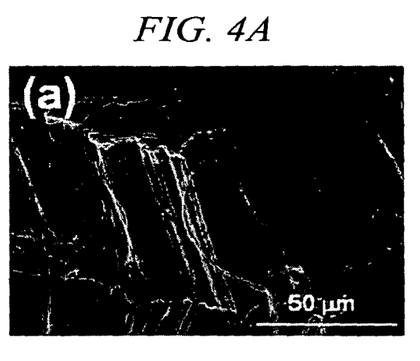
FIG. 4A is a micrograph view of a vertically aligned nanotubes array (VANTA), representing an embodiment of the invention.
Figure 4B:
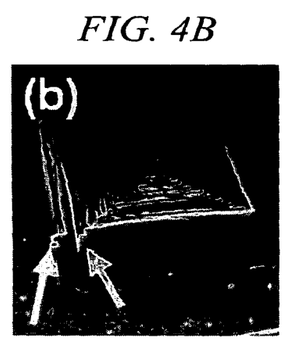
FIG. 4B is a micrograph view of a patterned vertically aligned nanotubes array (VANTA), representing an embodiment of the invention.
Figure 4C:
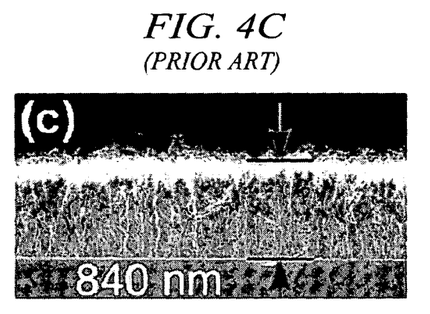
FIG. 4C is a micrograph view of a vertically aligned nanotubes array (VANTA), appropriately labeled "PRIOR ART."
Figure 4D:
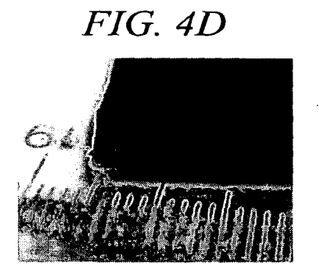
FIG. 4D is a micrograph view of an epoxy vertically aligned nanotubes array (VANTA) composite composition, representing an embodiment of the invention.
Figure 4E:
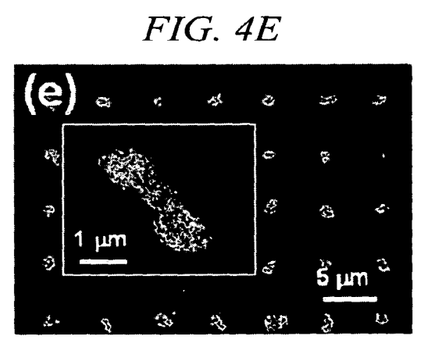
FIG. 4E is a composite micrograph view of a vertically aligned nanotubes array (VANTA), representing an embodiment of the invention.

VANTAs may be created on patterned substrates with feature sizes as small as 1 micron, as shown in FIG. 4E. FIG. 4B depicts a patterned VANTA. Thus, VANTAs may be preconfigured into optimal patterns for thermal interface materials (TIM's) to match with semiconductor chip dimensions, for example.

Figure 4F:
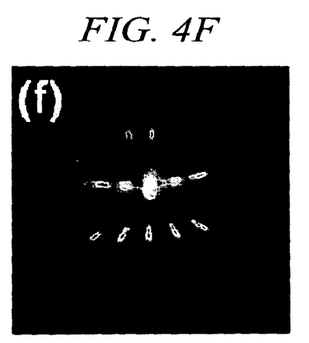
FIG. 4F is a optical diffraction view of a vertically aligned nanotubes array (VANTA), representing an embodiment of the invention.

FIGS. 4A and 4C are electron micrographs of VANTAs showing flat tops (within ~20 nm rms thickness) indicative of a coordinated growth mode. FIG. 4D shows an epoxy-VANTA composite retaining the 2 mm height of the original VANTA. FIG. 4E depicts a VANTA grown on 1 micron dots, capable of producing photonic diffraction patterns from visible light as shown in FIG. 4F.

VANTA Crystallinity Control

Embodiment of the invention can use time resolved reflectivity (TRR) monitoring to control the growth conditions to guarantee high crystallinity of the nanotubes in the VANTAS. The growth rate of the VANTAs, (resulting from the feedstock gas, activity of the catalyst, temperature, and flow conditions) has been found to be a key factor controlling the defect density in the nanotubes of the VANTA. Nanotubes with low defect densities (as evidenced by Raman spectra with high G:D band intensities, see next section) have high thermal conductivities. Since the growth rate of a VANTA during synthesis may be measured and controlled in situ via time resolved reflectivity (TRR) (by in-turn adjusting the process parameters) the crystallinity of the array may be controlled to produce high crystallinity VANTAs with high thermal conductivity.

Characterization of Highly Thermally Conducting VANTAs—(HTCVANTAs)

VANTAs can be characterized by scanning electron microscopy (SEM), high resolution transmission electron microscopy (HRTEM), resonance Raman spectroscopy (RRS), and flash diffusivity measurements (FDM). High resolution transmission electron microscopy (HRTEM), as shown in FIGS. 3A-3B and 5A-5C, provides information on the number of walls of the nanotubes and their wall defects.

Figure 5A:
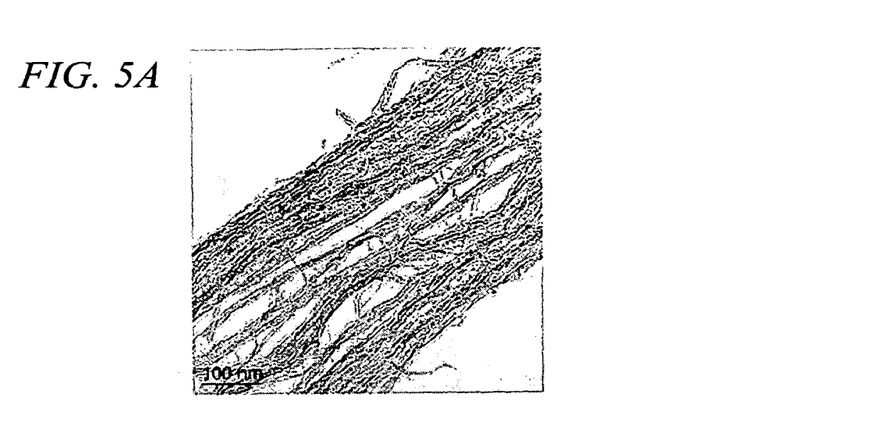
FIG. 5A is a micrograph view of a sample from a vertically aligned nanotubes array (VANTA), representing an embodiment of the invention.
Figure 5B:
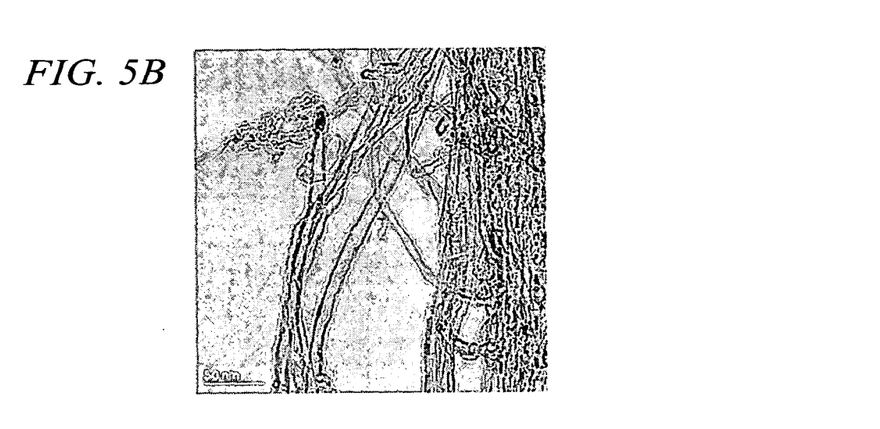
FIG. 5B is a micrograph view of a sample from a vertically aligned nanotubes array (VANTA), representing an embodiment of the invention.
Figure 5C:
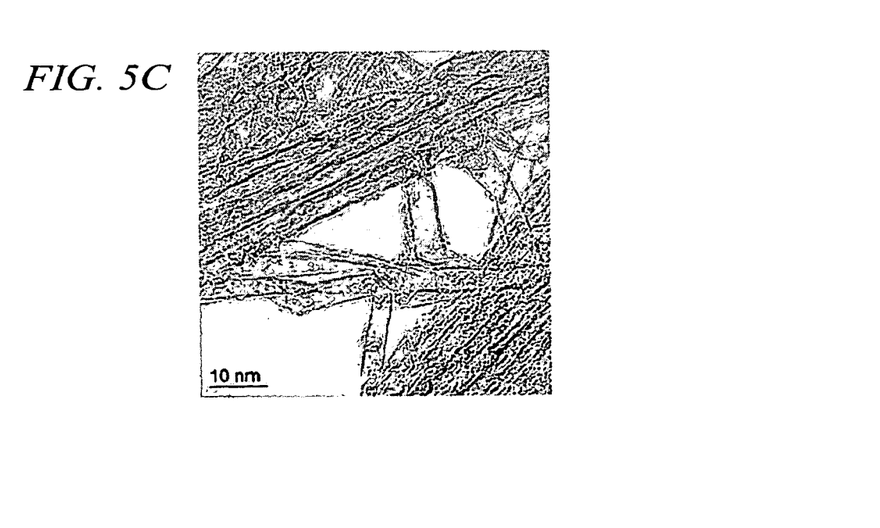
FIG. 5C is a closer view of the VANTA shown in FIG. 5A.

Referring to FIGS. 5A-5C, typical high resolution transmission electron microscopy (HRTEM) images of nanotubes extracted from a VANTA are depicted. Arrays typically contain FWNT in different proportions and spacings. FIG. 5A shows the alignment of nanotubes and spacing between the nanotubes in a VANTA array. Note that this sample was removed from the array and placed on a TEM grid, so the actual spacing between the nanotubes may have changed. FIG. 5B shows a closer view, with all the nanotubes being hollow while different nanotubes contain different numbers of walls with n<=3 (in this sample). FIG. 5C shows a closer view of the sample represented in FIG. 5A with a large-diameter double-walled nanotube labeled LD, a large-diameter single-wall carbon nanotubes labeled LS, and a small-diameter single-wall carbon nanotubes labeled SS, all clearly visible.

Figure 6A:
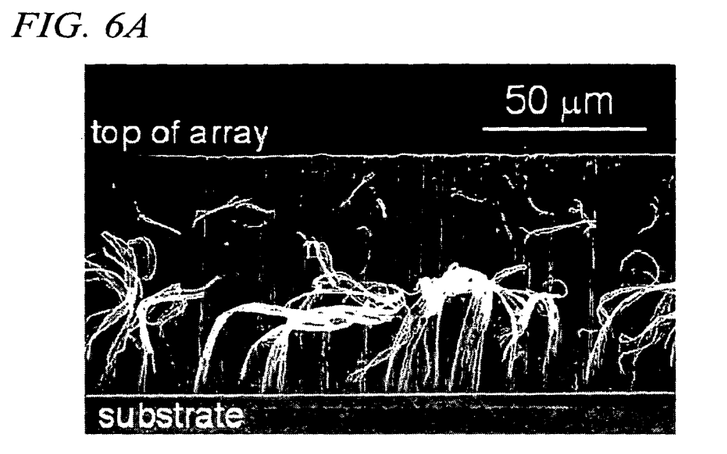
FIG. 6A is a micrograph view of a sample from a vertically aligned nanotubes array (VANTA), representing an embodiment of the invention.
Figure 6B:
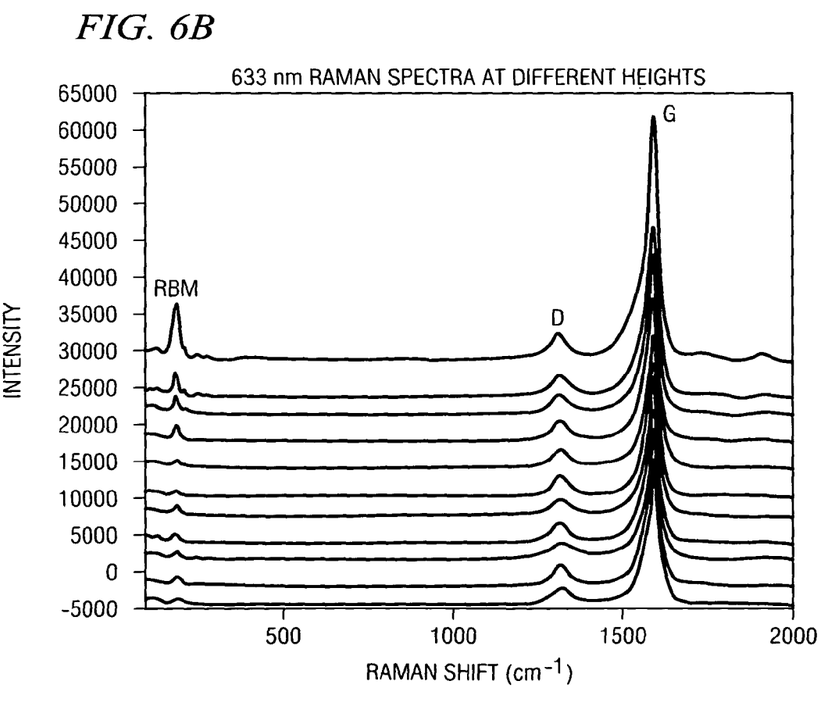
FIG. 6B is a view of traces of intensity as a function of Raman shift at different heights of a vertically aligned nanotubes array (VANTA), representing an embodiment of the invention.
Figure 6C:
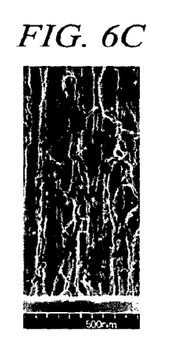
FIG. 6C is a micrograph view of a vertically aligned nanotubes array (VANTA), representing an embodiment of the invention.
Figure 6D:
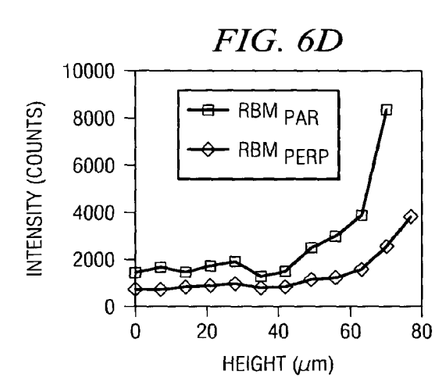
FIG. 6D is a view of parallel and perpendicular traces of RBM intensity as a function of height, representing an embodiment of the invention.
Figure 6E:
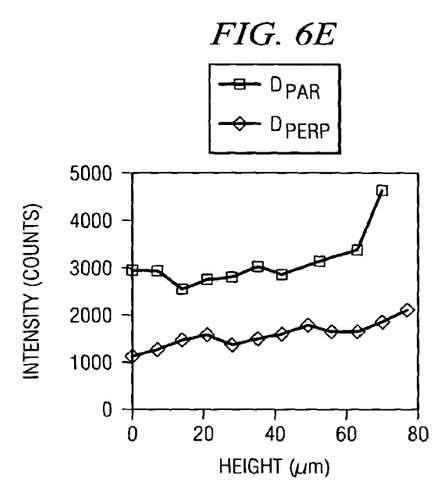
FIG. 6E is a view of parallel and perpendicular traces of D intensity as a function of height, representing an embodiment of the invention.
Figure 6F:
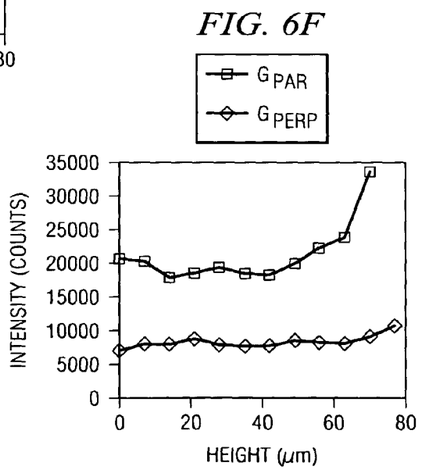
FIG. 6F is a view of parallel and perpendicular traces of G intensity as a function of height, representing an embodiment of the invention.

Referring to FIG. 6A, SEM images of scribed and broken wafers can provide visual estimates of the alignment of the nanotubes within the VANTA and the spacing between the nanotubes in the VANTA. Referring to FIG. 6B, the presence of SWNTs in the VANTA is indicated by the appearance of the radial breathing mode (RBM) in the resonant Raman spectra (RRS) of the array. Using a probe beam of ~2 micron size, the composition of the VANTA may be examined as shown in FIGS. 6D-6F. In more detail, by rotating the polarization of the laser used for RRS, the alignment of the nanotubes in the VANTA may be characterized. It is important to appreciate that the ratio of G-band intensity to D-band intensity is an indication of the types of nanotubes and their defectiveness. Generally, when G:D=1:1 the array consists of all MWNT. FIGS. 6A-6F depict SEM and microRaman microscopy analysis of a VANTA. Polarized microRaman spectroscopy is used to probe ~2 micron spots along the side of a VANTA which has been scribed and broken. The presence of RBM in the RRS spectra indicate that SWNTs are present throughout the array. The ratio of RBM intensities using polarization of the probe light in the parallel (to the VANTA axis top-bottom of the array) direction compared to perpendicular direction, give an estimate of the alignment of the nanotubes in the array. The G-band intensity divided by the D-band intensity gives an estimate of the quality of the array. As shown in FIGS. 6A-6F, for those VANTAs containing SWNTs, variation of the G:D band ratios is observed from the top of the array to the bottom, indicating relatively fewer SWNTs in regions of low G:D (at the bottom in FIGS. 6B-6C). High quality arrays, as shown in FIGS. 6A-6C, have G:D ratios >5 across their entire breadth (i.e., from top to bottom) when probed side-on. The invention can include embodiments having G:D ratios of greater than approximately 1, approximately 1.5, approximately 2, approximately 2.5, approximately 3, approximately 3.5, approximately 4, approximately 4.5, approximately 5, approximately 5.5, approximately 6, approximately 6.5, approximately 7, approximately 7.5, approximately 8, approximately 8.5, approximately 9, approximately 9.5, approximately 10, etcetera.

Alignment of the nanotubes in the array is estimated by taking the ratio of parallel intensity to perpendicular intensity of the RBM and/or G-band as measured with the incident polarization correspondingly parallel:perpendicular to the apparent nanotube direction. As shown in FIGS. 6D-6F, both the G-band and RBM bands intensities exhibit parallel:perpendicular intensity ratios of ~3 in high-quality VANTAs. The invention can include embodiments where one or both of the G-band and RBM bands intensities exhibit parallel:perpendicular intensity ratios of greater than approximately 2, approximately 2.5, approximately 3, approximately 3.5, approximately 4, approximately 4.5, approximately 5, etcetera.

Figure 7:
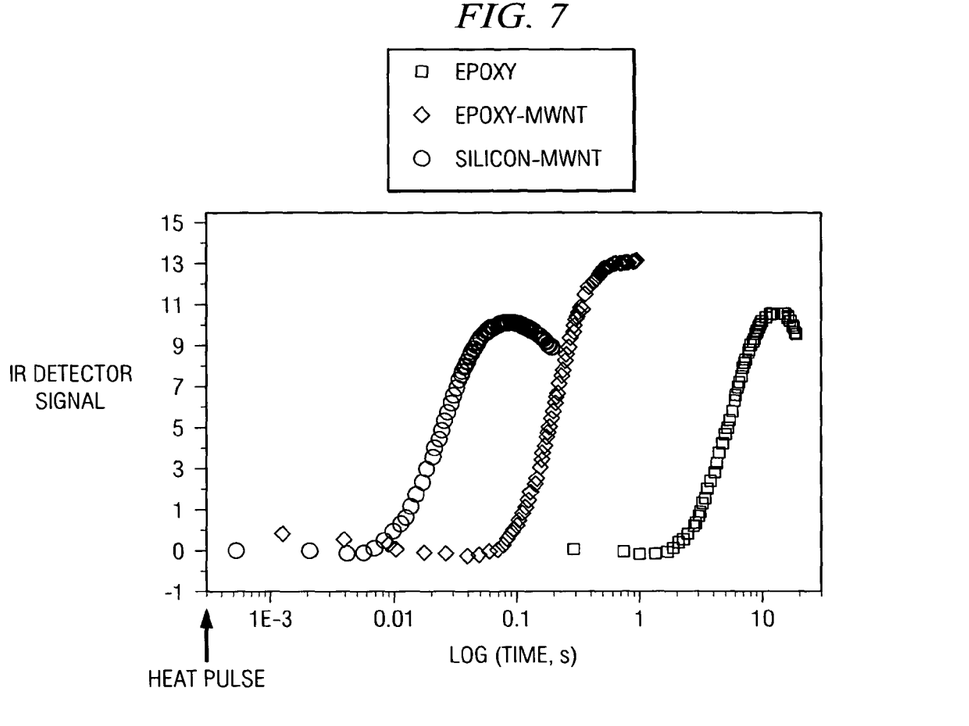
FIG. 7 is a view of traces of an infrared detector signal as function of logarithmic time for three different compositions, representing an embodiment of the invention.

The thermal properties of the arrays were measured using a standardized ASME procedure for flash diffusivity infrared detection. Long, continuous VANTAs of known height >400 microns were measured. Typical data is shown in FIG. 7. Following application of a ~7 ms heating pulse from a Xe flashlamp, a fast InSb detector records the arrival of infrared radiation through the sample. Known calibration standards ensured accurate system response. FIG. 7 shows the heat pulse arriving through 2 mm of pure epoxy (peak of pulse ~15 seconds), through 2 mm of epoxy containing 4.7 vol. % VANTAs (peak of pulse ~0.12 seconds), and through as-grown VANTAs on Si in air (peak of pulse ~0.06 seconds). From the waveforms measured by this technique, the thermal diffusivity of the array is determined.

Figure 8:
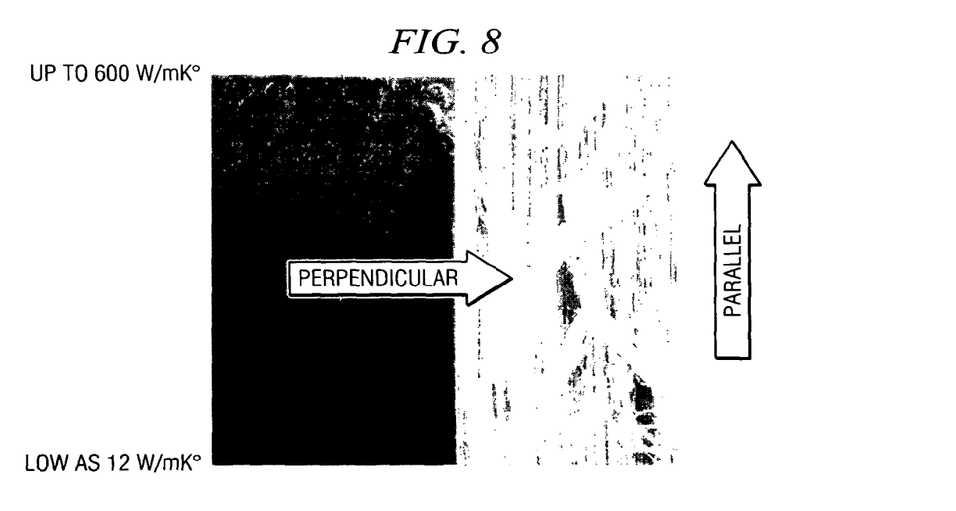
FIG. 8 is a schematic view of heat flow as a function of orientation, representing an embodiment of the invention.

FIG. 7 depicts Xe flashlamp diffusivity data for 2 mm of pure epoxy (peak of pulse ~15 seconds), 2 mm of epoxy containing 4.7 vol. % VANTAs (peak of pulse ~0.12 seconds), and through as-grown 2-mm-long VANTAs on Si in air (peak of pulse ~0.06 seconds). From the measured thermal diffusivities and array densities (obtained by weighing the arrays and dividing by their apparent volume), and using the specific heat of graphite, thermal conductivities of the nanotubes in the arrays can be estimated. As depicted in FIG. 8, the thermal conductivities measured for nanotubes in these arrays may exceed 600 W/mK along the parallel direction while being as low as 12 W/mK in the perpendicular direction. This anisotropy (50:1) in the example and some materials defines a unique characteristic of this invention.

FIG. 8 depicts thermal conductivities in the parallel direction (parallel to the apparent direction of the nanotubes in the array) compared to the perpendicular direction may be slightly anisotropic to highly anisotropic, depending on the characteristics of the VANTA. In some arrays, thermal conductivities up to 600 W/mK (parallel) and 12 W/mK (perpendicular) have been measured for an anisotropy of 50:1.

As indicated above, the ratio of G:D band intensity ratio for the RRS signal of the synthesized nanotubes is a measure of their quality. It is an enabling feature of the invention that the G:D ratio of the nanotubes in our studies has been directly correlated with their thermal diffusivity—with higher thermal diffusivities correlating with higher G:D band ratios. Similarly, the width of the G band of our VANTA arrays has been correlated with their thermal diffusivities—with increasing thermal diffusivity at lower G band widths. The invention can include VANTA with nanotubes characterized by a G Raman mode band width of less than approximately 20 cm−1 measured at 633 nm across substantially all of the vertically aligned nanotube array, by a G Raman mode band width of less than approximately 15 cm−1 measured at 633 nm across substantially all of the vertically aligned nanotube array, by a G Raman mode band width of less than approximately 10 cm−1 measured at 633 nm across substantially all of the vertically aligned nanotube array, by a G Raman mode band width of less than approximately 5 cm−1 measured at 633 nm across substantially all of the vertically aligned nanotube array.

Figure 9A:
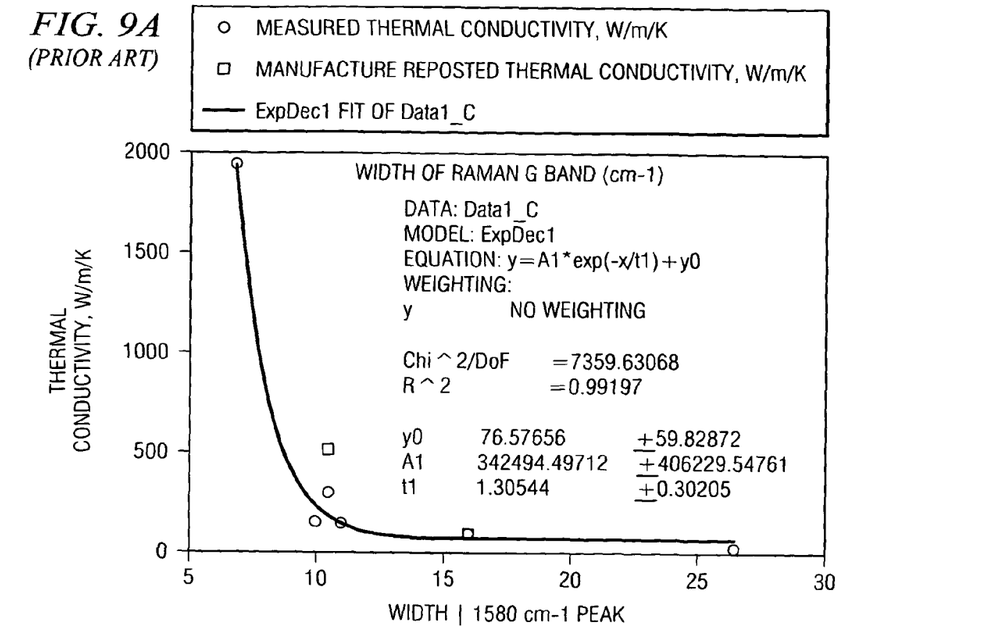
FIG. 9A is a view of a trace of thermal conductivity as a function of the width of Raman G band, representing an embodiment of the invention.
Figure 9B:
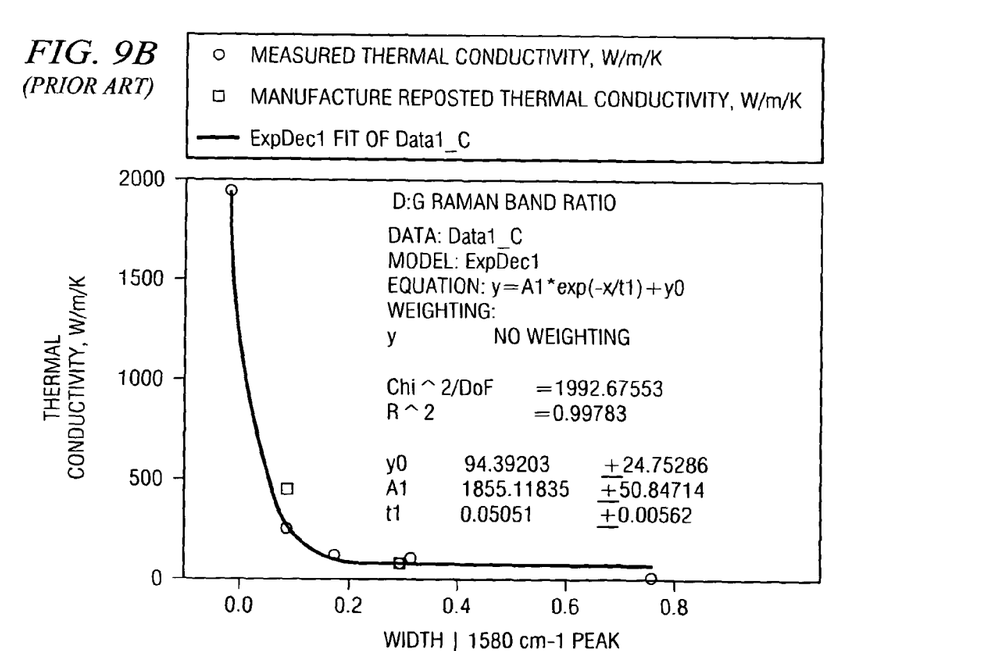
FIG. 9B is a view of a trace of thermal conductivity as a function of D:G Raman band ratio, representing an embodiment of the invention.

This has some precedent, as indicated in FIGS. 9A-9B for commercial carbon fibers, where D:G ratios below 0.2 show dramatic increases in thermal conductivity, as well as G band widths below 10 cm−1. It is important to note that the high thermal diffusivities measured for our long VANTAs have been found for G:D ratios <2, while we have grown VANTAs with sustained G:D ratios across their entire height >7. FIGS. 6A-6F exhibits an array with G:D >5 across the entire length (bottom to top).

FIGS. 9A-9B depict correlation of thermal conductivity values of commercial carbon fibers vs. D:G ratio (Dresselhaus, 1985), showing dramatic increase in properties for D:G <0.2). We claim as part of our invention annealing treatments to increase the G:D ratio of our VANTAs after their synthesis. Annealing of nanotubes at high temperatures in vacuum has been shown to increase their crystallinity, thereby increasing their G:D band ratio above their as-synthesized value.

Methods of Fabricating Composites from VANTAs

This invention includes highly thermally conducting composites made with VANTAs. Methods for composite fabrication include methods which preserve the key compositional elements required for VANTAs—alignment, spacing, and high thermal diffusivity. Methods for infiltration using liquids of sufficient viscosity not to induce aggregation of the nanotubes in the VANTA and preserve the height of the VANTA. Such an epoxy composite is shown in FIG. 4D, which displayed an enhancement of 24 in thermal diffusivity compared to epoxy alone while using only 2 wt. % VANTA in epoxy. Methods for gas phase infiltration of VANTAs as deposited by physical vapor deposition of glass, CVD infiltration of carbon, or other materials. Methods for electroplating of metals utilizing the VANTAs as electrochemical electrodes.

As shown in the accompanying figures, VANTAs fabricated and characterized by the above descriptions of this invention can be reproducibly controlled in characteristics to achieve very high thermal diffusivities. It is important to note that VANTAs can be fabricated by many techniques, but the understanding of which parameters are important for high thermal diffusivity and the ability to make the thermal diffusivity measurements are made possible through the combined techniques described above.

The invention can include VANTAs whose alignment of nanotubes is >2:1 as measured by polarized Raman microscopy intensity ratios of both G bands and RBM bands at all points along the array (e.g., at least 10 measurements along the length of the nanotubes from top to bottom of the array). The invention can include VANTAs where density of the arrays is between 0.1 and 1 g/cm3, as determined by weighing the array and estimating its overall height, length, and width for an apparent volume. The invention can include VANTAs where the spacing of nanotubes inside the array—linear densities of nanotubes—is between 20-200 nanotubes per micron as counted on the edge of a scribed wafer and measured by SEM imaging for nanotubes with diameters <5 nm. The invention can include VANTAs where the number of walls of the nanotubes in the array is n, where n=1-10 mixed, n<=3, n<=2 and/or n=1. The invention can includes embodiments where continuous nanotubes are grown and exist from the substrate to the top of the array (however not all nanotubes in the VANTA need be continuous).

The invention can include VANTAs where the height of the nanotubes in the arrays is h, where 50 nm<=h<=20 microns controllable within 50 nm, where h>20 microns controllable within 20 microns, where h>=400 microns for qualified thermal diffusivity characterization and/or where h>=1 mm. The invention can include VANTAs where thermal diffusivities is k, where k>=0.4 cm2/s of as-grown VANTAs in air, where k>=1 cm2/s of as grown VANTAs in vacuum, where k>=0.2 cm2/s of epoxy 98% VANTAs 2 wt. % composite and/or where k>=2 cm2/s of as grown VANTAs in vacuum. The invention can include VANTAs with thermal conductivities per density (specific thermal conductivity) of k', where k'>=6 cm2/s per g/cm3. The invention can include VANTAs with an anisotropic thermal diffusivity ratio measured parallel: perpendicular to the preferred nanotube direction of the VANTA of from approximately 1:1 diffusivity anisotropy to approximately 50:1 diffusivity anisotropy Practical Applications A practical application of an embodiment of the invention that has value within the technological arts is as a thermal sink coupling. For instance, embodiments of the invention are of direct and immediate interest for microelectronics thermal interface materials which channel heat from highly-integrated transistor chips to cooling fins. VANTA embodiments of the invention can be utilized as a thermal contact "brush" to mate with irregular surfaces and make good contact for thermal management applications.

Another practical application of embodiments of the invention is in commercial air vehicles, high performance aircraft and/or hypersonic aircraft. For instance, VANTA embodiments of the invention can be used in hypersonic vehicles' leading edges, where heat must be drained from very hot surfaces. VANTA embodiments of the invention can be utilized in a carbon-carbon brake material or tire enhancement to disperse heat directionally in said structures. Embodiments of the invention can be utilized as an enhancement to carbon fibers or foams, by growing VANTAs directly from the exposed surfaces of said structures. VANTA embodiments of the invention can be utilized as microfluidic heat injectors and drains, and drivers for convective flow in such injectors and drains. VANTA embodiments of the invention can be utilized as an electrode for organic light emitting diodes which is potted in OLED conducting polymer, with the VANTA serving both as heat sink and electrode. There are virtually innumerable uses for an embodiment of the invention, all of which need not be detailed here.

Advantages

Embodiments of the invention, can be cost effective and advantageous for at least the following reasons. The benefits of the invention are a new class of nanostructured thermal interface materials for high value-added applications. These benefits should accrue in the microelectronics and aerospace sectors. The main advantages of this technology over existing thermal interface materials (TIMs) are (a) high native thermal diffusivity, (b) ability to be infiltrated with conductive pastes or polymers or resins, (c) conformable top and bottom surfaces for good thermal contact to surfaces with micro-protrusions (areas which normally yield gaps and poor thermal interfaces), (d) very small thermal expansion coefficient, for multiple thermal cycles without losing contact to the surfaces it is interfacing. Embodiments of the invention have higher thermal diffusivity than ORNL POCO graphite foam, with the additional advantage of much higher directional properties. Embodiments of the invention have the additional advantage of being nanostructured and are, therefore, capable of being fabricated into specific shapes and heights directly during manufacturing. In addition, the thermal interface to the mating surface can be provided by many conformable contact points instead of a machined surface, providing additional advantages for better thermal Interfaces. Embodiments of the invention improve quality and/or reduces costs compared to previous approaches.

Definitions

The term substantially is intended to mean largely but not necessarily wholly that which is specified. The term approximately is intended to mean at least close to a given value (e.g., within 10% of). The term generally is intended to mean at least approaching a given state. The term coupled is intended to mean connected, although not necessarily directly, and not necessarily mechanically. The term proximate, as used herein, is intended to mean close, near adjacent and/or coincident; and includes spatial situations where specified functions and/or results (if any) can be carried out and/or achieved. The term deploying is intended to mean designing, building, shipping, installing and/or operating.

The terms first or one, and the phrases at least a first or at least one, are intended to mean the singular or the plural unless it is clear from the intrinsic text of this document that it is meant otherwise. The terms second or another, and the phrases at least a second or at least another, are intended to mean the singular or the plural unless it is clear from the intrinsic text of this document that it is meant otherwise. Unless expressly stated to the contrary in the intrinsic text of this document, the term or is intended to mean an inclusive or and not an exclusive or. Specifically, a condition A or B is satisfied by any one of the following: A is true (or present) and B is false (or not present), A is false (or not present) and B is true (or present), and both A and B are true (or present). The terms a or an are employed for grammatical style and merely for convenience.

The term plurality is intended to mean two or more than two. The term any is intended to mean all applicable members of a set or at least a subset of all applicable members of the set. The phrase any integer derivable therein is intended to mean an integer between the corresponding numbers recited in the specification. The phrase any range derivable therein is intended to mean any range within such corresponding numbers. The term means, when followed by the term "for" is intended to mean hardware, firmware and/or software for achieving a result. The term step, when followed by the term "for" is intended to mean a (sub)method, (sub)process and/or (sub)routine for achieving the recited result.

The terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. The terms "consisting" (consists, consisted) and/or "composing" (composes, composed) are intended to mean closed language that does not leave the recited method, apparatus or composition to the inclusion of procedures, structure(s) and/or ingredient(s) other than those recited except for ancillaries, adjuncts and/or impurities ordinarily associated therewith. The recital of the term "essentially" along with the term "consisting" (consists, consisted) and/or "composing" (composes, composed), is intended to mean modified close language that leaves the recited method, apparatus and/or composition open only for the inclusion of unspecified procedure(s), structure(s) and/or ingredient(s) which do not materially affect the basic novel characteristics of the recited method, apparatus and/or composition. Unless otherwise defined, all technical and scientific terms used herein have the same meaning as commonly understood by one of ordinary skill in the art to which this invention belongs. In case of conflict, the present specification, including definitions, will control.

CONCLUSION

The described embodiments and examples are illustrative only and not intended to be limiting. Although embodiments of the invention can be implemented separately, embodiments of the invention may be integrated into the system(s) with which they are associated. All the disclosed embodiments of the invention disclosed herein can be made and used without undue experimentation in light of the disclosure. Although the best mode of the invention contemplated by the inventor(s) is disclosed, embodiments of the invention are not limited thereto.

Embodiments of the invention are not limited by theoretical statements (if any) recited herein. The individual steps of embodiments of the invention need not be performed in the disclosed manner, or combined in the disclosed sequences, but may be performed in any and all manner and/or combined in any and all sequences. The individual components of embodiments of the invention need not be formed in the disclosed shapes, or combined in the disclosed configurations, but could be provided in any and all shapes, and/or combined in any and all configurations. The individual components need not be fabricated from the disclosed materials, but could be fabricated from any and all suitable materials. Homologous replacements may be substituted for the substances described herein.

It can be appreciated by those of ordinary skill in the art to which embodiments of the invention pertain that various substitutions, modifications, additions and/or rearrangements of the features of embodiments of the invention may be made without deviating from the spirit and/or scope of the underlying inventive concept. All the disclosed elements and features of each disclosed embodiment can be combined with, or substituted for, the disclosed elements and features of every other disclosed embodiment except where such elements or features are mutually exclusive. The spirit and/or scope of the underlying inventive concept as defined by the appended claims and their equivalents cover all such substitutions, modifications, additions and/or rearrangements.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

REFERENCES

1. D. B. Geohegan, A. A. Puretzky, I. N. Ivanov, S. Jesse, G. Eres, J. Y. Howe, "In situ growth rate measurements and length control during chemical vapor deposition of vertically aligned multiwall carbon nanotubes," Applied Physics Letters, Volume 83, number 9, Sep. 1, 2003.
2. Dresselhaus, et al, Phys. Rev. B (1985)
3. Handbook of Chemistry and Physics, 81$^{st}$ Edition, CRC Press, 2000.

What is claimed is:

1. A composition, comprising a vertically aligned nanotube array including a plurality of nanotubes, each of the nanotubes coupled at a proximal end to a substrate, wherein a defect density of the plurality of nanotubes decreases as a function of distance from the substrate as characterized by a G:D Raman mode band intensity ratio that increases as the function of distance from the substrate across substantially all of the vertically aligned nanotube array.

2. The composition, of claim 1, wherein the defect density of the plurality of nanotubes is characterized by a G:D Raman mode band intensity ratio of greater than approximately 1 across substantially all of the vertically aligned nanotube array.

3. The composition of claim 2, wherein the G:D Raman mode band intensity ratio is greater than approximately 1.5.

4. The composition of claim 3, wherein the G:D Raman mode band intensity ratio is greater than approximately 5.

5. The composition of claim 4, wherein the G:D Raman mode band intensity ratio is greater than approximately 7.

6. The composition of claim 1, wherein thermal diffusivity of the plurality of nanotubes is characterized by a G Raman mode band width of less than approximately 20 cm−1 measured at 633 nm across substantially all of the vertically aligned nanotube array.

7. The composition of claim 6, wherein the G Raman mode band width is less than approximately 10 cm−1 measured at 633 nm.

8. The composition of claim 1, wherein alignment of the plurality of nanotubes is characterized by a polarized Raman mode band parallel:perpendicular intensity ratio of greater than approximately 2 as measured by at least one member selected from the group consisting of a G band intensity and an RBM band intensity across substantially all of the vertically aligned nanotube array.

9. The composition of claim 8, wherein alignment of the plurality of nanotubes is characterized by the polarized Raman mode band parallel:perpendicular intensity ratio of greater than approximately 2 as measured by both the G band intensity and the RBM band intensity across substantially all of the vertically aligned nanotube array.

10. The composition of claim 8, wherein the polarized Raman mode band parallel:perpendicular intensity ratio is greater than approximately 3.

11. The composition of claim 1, wherein the substrate includes at least one member selected from the group consisting of carbon fiber and carbon foam.

12. The composition of claim 1, wherein the plurality of nanotubes consist essentially of carbon.

13. A composition, comprising a vertically aligned nanotube array on a substrate, the vertically aligned nanotube array including a plurality of nanotubes wherein a defect density of the plurality of nanotubes is characterized by a G:D Raman mode band intensity ratio of greater than approximately 1 across substantially all of the vertically aligned nanotube array and as a function of distance from the substrate.

14. The composition of claim 13, wherein the G:D Raman mode band intensity ratio is greater than approximately 1.5.

15. The composition of claim 14, wherein the G:D Raman mode band intensity ratio is greater than approximately 5.

16. The composition of claim 15, wherein the G:D Raman mode band intensity ratio is greater than approximately 7.

17. The composition of claim 13, wherein thermal diffusivity of the plurality of nanotubes is characterized by a G Raman mode band width of less than approximately 20 cm−1 measured at 633 nm across substantially all of the vertically aligned nanotube array.

18. The composition of claim 17, wherein the G Raman mode band width is less than approximately 10 cm−1 measured at 633 nm.

19. The composition of claim 13, wherein alignment of the plurality of nanotubes is characterized by a polarized Raman mode band parallel:perpendicular intensity ratio of greater than approximately 2 as measured at least one member selected from the group consisting of a G band intensity and an RBM band intensity across substantially all of the vertically aligned nanotube array.

20. The composition of claim 19, wherein alignment of the plurality of nanotubes is characterized by the polarized Raman mode band paralle:perpendicular intensity ratio of greater than approximately 2 as measured by both the G band intensity and the RBM band intensity across substantially all of the vertically aligned nanotube array.

21. The composition of claim 19, wherein the polarized Raman mode band parallel:perpendicular intensity ratio is greater than approximately 3.

22. The composition of claim 13, wherein the defect density of the plurality of nanotubes decreases as the function of distance from the substrate as characterized by a G:D Raman mode band intensity ratio that increases as the function of distance from the substrate across substantially all of vertically aligned nanotube array.

23. The composition of claim 22, wherein the substrate includes at least one member selected from the group consisting of carbon fiber and carbon foam.

24. The composition of claim 13, wherein the plurality of nanotubes consist essentially of carbon.

25. A composition, comprising a vertically aligned nanotube array on a substrate, the vertically aligned nanotube array including a plurality of nanotubes wherein alignment of the plurality of nanotubes is characterized by a polarized Raman mode band parallel:perpendicular intensity ratio of greater than approximately 2 as measured by at least one member selected from a G band intensity and an RBM band intensity across substantially all of the vertically aligned nanotube array and as a function of distance from the substrate.

26. The composition of claim 25, wherein alignment of the plurality of nanotubes is characterized by the polarized Raman mode band parallel:perpendicular intensity ratio of greater than approximately 2 as measured by both the G band intensity and the RBM band intensity across substantially all of the vertically aligned nanotube array and as the function of distance from the substrate.

27. The composition of claim 25, wherein the polarized Raman mode band parallel:perpendicular intensity ratio is greater than approximately 3.

28. The composition of claim 25, wherein a defect density of the plurality of nanotubes is characterized by a G:D Raman mode band intensity ratio of greater than approximately 1 across substantially all of the vertically aligned nanotube array.

29. The composition of claim 28, wherein the G:D Raman mode band intensity ratio is greater than approximately 1.5.

30. The composition of claim 29, wherein the G:D Raman mode band intensity ratio is greater than approximately 5.

31. The composition of claim 30, wherein the G:D Raman mode band intensity ratio is greater than approximately 7.

32. The composition of claim 25, wherein thermal diffusivity of the plurality of nanotubes is characterized by a G Raman mode band width of less than approximately 20 cm−1 measured at 633 nm across substantially all of the vertically aligned nanotube array.

33. The composition of claim 32, wherein the G Raman mode band width is less than approximately 10 cm−1 measured at 633 nm.

34. The composition of claim 25, wherein a defect density of the plurality of nanotubes decreases as the function of distance from the substrate as characterized by a G:D Raman mode band intensity ratio that increases as the function of distance from the substrate across substantially all of the vertically aligned nanotube array.

35. The composition of claim 34, wherein the substrate includes at least one member selected from the group consisting of carbon fiber and carbon foam.

36. The composition of claim 25, wherein the plurality of nanotubes consist essentially of carbon.

* * * * *